US008927334B2

(12) United States Patent
Daubenspeck et al.

(10) Patent No.: US 8,927,334 B2
(45) Date of Patent: Jan. 6, 2015

(54) OVERCOMING CHIP WARPING TO ENHANCE WETTING OF SOLDER BUMPS AND FLIP CHIP ATTACHES IN A FLIP CHIP PACKAGE

(71) Applicant: International Business Machines Corporation, Armonk, NY (US)

(72) Inventors: Timothy H. Daubenspeck, Colchester, VT (US); Jeffrey P. Gambino, Westford, VT (US); Christopher D. Muzzy, Burlington, VT (US); Nathalie Normand, Bromont, CA (US); David L. Questad, Hopewell Junction, NY (US); Wolfgang Sauter, HinesBurg, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 226 days.

(21) Appl. No.: 13/626,032

(22) Filed: Sep. 25, 2012

(65) Prior Publication Data

US 2014/0084453 A1 Mar. 27, 2014

(51) Int. Cl.
*H01L 23/48* (2006.01)
*H01L 21/60* (2006.01)

(52) U.S. Cl.
USPC ............ 438/108; 438/106; 361/760; 174/260

(58) Field of Classification Search
CPC ..... H01L 23/12; H01L 23/145; H01L 23/147; H01L 23/15
USPC .................... 438/106, 108; 361/760; 174/260
See application file for complete search history.

(56) References Cited

U.S. PATENT DOCUMENTS

| 5,319,570 | A | 6/1994 | Davidson et al. |
| 5,801,084 | A | 9/1998 | Beasom et al. |
| 6,309,965 | B1 | 10/2001 | Matschitsch et al. |
| 7,169,685 | B2 | 1/2007 | Connell et al. |
| 7,208,396 | B2 | 4/2007 | Felmetsger |
| 7,319,066 | B2 | 1/2008 | Saiki et al. |
| 7,691,746 | B2 | 4/2010 | Bhowmik et al. |
| 7,727,785 | B2 | 6/2010 | Connell et al. |
| 7,880,278 | B2 | 2/2011 | Jeng et al. |
| 7,892,894 | B2 | 2/2011 | Do et al. |
| 8,053,334 | B2 | 11/2011 | Yokokawa et al. |
| 8,053,354 | B2 | 11/2011 | Lehr et al. |
| 2007/0267724 | A1* | 11/2007 | Jeng et al. ..................... 257/632 |
| 2009/0085228 | A1* | 4/2009 | Sun et al. ...................... 257/783 |
| 2010/0314725 | A1* | 12/2010 | Gu et al. ....................... 257/635 |

* cited by examiner

*Primary Examiner* — Colleen A Matthews
*Assistant Examiner* — William Harriston
(74) *Attorney, Agent, or Firm* — Gibb & Riley, LLC; David A. Cain, Esq.

(57) ABSTRACT

Structures and methods for forming good electrical connections between an integrated circuit (IC) chip and a chip carrier of a flip chip package include forming one of: a tensile layer on a front side of the IC chip, which faces a tops surface of the chip carrier, and a compressive layer on the backside of the IC chip. Addition of one of: a tensile layer to the front side of the IC chip and a compressive layer the backside of the IC chip, may reduce or modulate warpage of the IC chip and enhance wetting of opposing solder surfaces of solder bumps on the IC chip and solder formed on flip chip (FC) attaches of a chip carrier during making of the flip chip package.

8 Claims, 7 Drawing Sheets

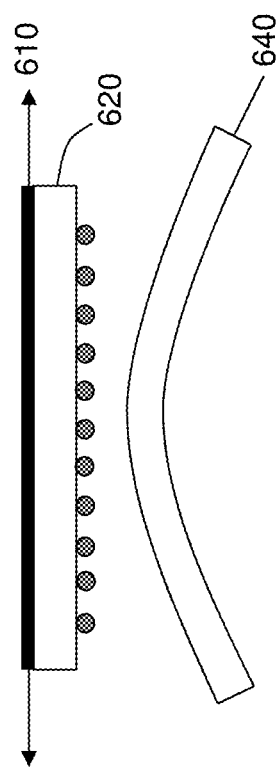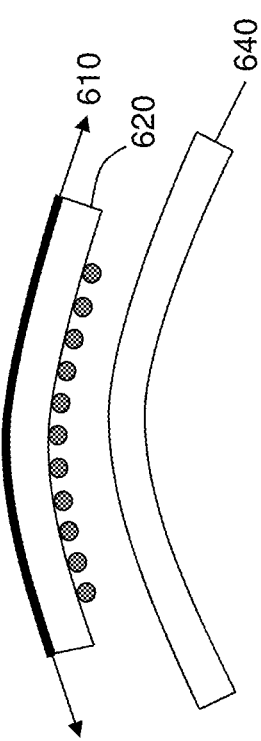
FIG. 6A
FIG. 6B

US 8,927,334 B2

OVERCOMING CHIP WARPING TO ENHANCE WETTING OF SOLDER BUMPS AND FLIP CHIP ATTACHES IN A FLIP CHIP PACKAGE

BACKGROUND

1. Field of the Invention

This disclosure generally relates to structures and methods for forming good electrical connections between an integrated circuit (IC) chip and a chip carrier of a flip chip package. More particularly, addition of one of: tensile layers and a compressive layer, to selected surfaces of IC chips in a wafer prior to solder bump re-heating, may reduce or modulate warpage of the IC chip and enhance wetting of opposing solder surfaces of solder bumps on the IC chip and solder formed on flip chip (FC) attaches of a chip carrier in a flip chip package.

2. Description of Related Art

The semiconductor marketplace continues to demand smaller devices, which require greater connectivity densities for packaging design. The increased functionality of smaller semiconductor devices requires an increased number of signal, power, and ground connections, and a corresponding decrease in connection pitch is required to maintain reasonable chip size. The combination of these requirements results in greater complexity of semiconductor packaging design.

Referring to FIG. 1, the packaging design requirement is especially critical in flip chip packages, where demand for a greater density of connections must coexist with good electrical and reliability performance. When compared to other packaging technologies, flip chip packaging significantly increases the number of signal, power and ground connections of the integrated circuit (IC) chip that are connected to the chip carrier through solder bumps or controlled collapse chip connections (C4s). Following solder re-heating, chip-join and cool-down, the solder bumps of the IC chip and the solder of the flip chip (FC) attaches of the chip carrier form electrical and mechanical connections between the IC chip and the chip carrier of the flip chip package. In turn, the FC attaches electrically connect through various pathways of the chip carrier to, for example, a ball grid array or land grid array that connect to a system board.

Typically, the process steps for a flip chip package include: creating IC chips on a silicon wafer; forming underbumps on a front side surface of the IC chip, i.e., above the silicon layers of the IC chip; depositing solder bumps or C4 connections on each of the underbumps; singulating or cutting the IC chips from the silicon wafer; "flipping" and positioning each IC chip, so that the solder bumps of the IC chip oppose the solder layers formed on the FC attaches of a chip carrier; and re-heating the solder bumps and the solder layers formed on the FC attaches to effect chip-join. Optionally, an electrically insulating underfill is subsequently introduced between the overlying IC chip and the underlying chip carrier, to prevent mechanical flexion of the solder connections between the IC chip and the chip carrier of the flip chip package.

Joining of the IC chip to the chip carrier requires re-heating of the solder bumps and the solder layers of the FC attaches, so as to "wet" the opposing solder surfaces of the solder bumps and the solder layers of the FC attaches. This wetting allows the miscible solders of the opposing solder surfaces to form an effective electrical connection upon subsequent cooling.

During heating, both the IC chip and the chip carrier can warp because of mismatches between the coefficients of thermal expansion (CTE) of their constituent layers. Relative to room temperature, as shown in the cross section of FIG. 2, the IC chip 220, at a temperature of 245° C., shows a slight negative warp, i.e., the IC chip's center is lower than the corners; whereas, the chip carrier 240 shows a positive warp, i.e., the chip carrier's center is higher than its corners. The relatively more compliant chip carrier typically warps to a greater extent than does the IC chip. Warping represents a change in height of sub-areas across the surface area of either the IC chip or the chip carrier relative to a reference plane at room temperature and at an elevated temperature. The extent of warping of the IC chip and the chip carrier is proportional to a radial distance from a centrally located neutral point, i.e., DNP, of each of the IC chip and the chip carrier. Hence, the relative movement between the opposing solders on the IC chip and the chip carrier is greatest at the edges of the IC chip. At peak elevated temperatures, e.g., 250° C., the solder of the solder bumps, along the edges of the IC chip, and the solder of the opposing FC attaches are physically separated and contact is impossible.

During subsequent cooling, the respective solders of the physically separated solder bumps of the IC chip and the opposing FC attaches of the chip carrier can solidify; thus, precluding any "wetting" of the two opposing solders to form a high quality electrical solder connection. Upon subsequent cooling to room temperature, the IC chip and the chip carrier can flatten; thus, providing physical contact (possibly, with mechanical deformation) at interfaces formed between the previously solidified solder bumps of the IC chip and the previously solidified solder layers of the FC attaches, i.e., a non-wet interface. However, the quality of the electrical contacts between these previously solidified solder contacts is not as good as that of "wetted" contacts between the two opposing miscible solders of the heated solder bumps of the IC chip and the heated solder layers of the FC attaches.

There remains a need to reliably form a "wet" contact between solder bumps of the integrated circuit (IC) chip and the solder layers of the opposing flip chip (FC) attaches of the chip carrier at an elevated temperature, where warping of the IC chip and the chip carrier may occur in a flip chip package.

SUMMARY OF INVENTION

In view of the foregoing, an exemplary embodiment of the disclosure may provide a flip chip package that includes a chip carrier and an integrated circuit (IC) chip positioned above the chip carrier, in which the IC chip has a front side that faces the chip carrier and a backside that is opposite the front side. The flip chip package may also include one of: a tensile film formed on the front side of the IC chip, in which the tensile film has a plurality of openings, each of the openings exposing the front side, and a compressive film formed on the backside of the IC chip. The flip chip package may further include a plurality of continuous solder columns located between the IC chip and the chip carrier, where each of the continuous solder columns extends from a flip chip (FC) attach on a top surface of the chip carrier to an opposing underbump formed on the front side of the IC chip.

Another exemplary embodiment of the disclosure may provide a method of making a flip chip package that includes forming a chip carrier with a plurality of flip chip (FC) attaches located on a top surface of the chip carrier, where a solder layer is formed on each FC attach. The method may also include forming a first tensile film on a front side of an integrated circuit (IC) chip and a second tensile film on a backside of the IC chip. The method may further include forming a plurality of openings in the first tensile film that expose portions of the front side of the IC chip. The method may yet further include forming a plurality of solder bumps on a corresponding plurality of underbumps, which are formed on the first side of the IC chip within each of the openings. Subsequently, the method may yet further include removing the second tensile film from the backside of the IC chip. The method may yet further include flipping and positioning the IC chip over the chip carrier, where the front side of the IC chip faces the top surface of the chip carrier, and each of the solder bumps opposes a solder layer formed on one of the FC attaches of the chip carrier. The method may yet further include heating the IC chip, the underbumps, the solder bumps, the solder layers formed on the FC attaches, and the chip carrier to an elevated temperature, to produce one of a flat IC chip and a positively warped IC chip. Finally, the method may include forming a plurality of continuous solder columns at room temperature from the underbumps to the opposing FC attaches, to form the flip chip package.

Yet another exemplary embodiment of the disclosure may provide a method of making a flip chip package that includes forming a chip carrier with a plurality of flip chip (FC) attaches located on a top surface of the chip carrier, where a solder layer is formed on each FC attach. The method may also include forming a plurality of solder bumps on a corresponding plurality of underbumps, which are formed on a front side of an integrated circuit (IC) chip. Subsequently, the method may further include forming a compressive film on a backside of the IC chip. The method may yet further include flipping and positioning the IC chip over the chip carrier, where the front side of the IC chip faces the top surface of the chip carrier, and each of the solder bumps opposes a solder layer formed on one of the FC attaches of the chip carrier. The method may yet further include heating the IC chip, the underbumps, the solder bumps, the solder layers formed on the FC attaches, and the chip carrier to an elevated temperature, to produce one of a flat IC chip and a positively warped IC chip. Finally, the method may include forming a plurality of continuous solder columns at room temperature from the underbumps to the opposing FC attaches, to form the flip chip package.

BRIEF DESCRIPTION OF THE DRAWINGS

The exemplary embodiments of the disclosures herein will be better understood from the following detailed description with reference to the drawings, which are not necessarily drawn to scale and in which:

FIG. 6A is a schematic diagram illustrating a cross section of a flip chip package, including an IC chip on which a compressive layer is formed on a backside of the IC chip, that produces a flat IC chip relative to a positively warped chip carrier at an elevated temperature in an exemplary embodiment;

FIG. 6B is a schematic diagram illustrating a cross section of a flip chip package, including an IC chip on which a compressive layer is formed on a backside of the IC chip, that produces a positively warped IC chip relative to a positively warped chip carrier at an elevated temperature in an exemplary embodiment;

DETAILED DESCRIPTION

Figure 2:
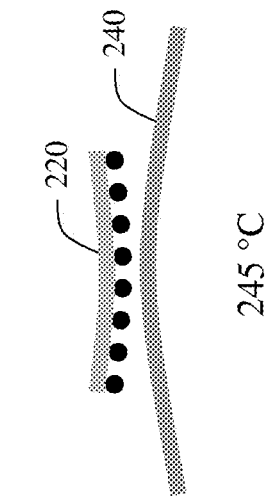
FIG. 2 is a schematic diagram of a flip chip package at room temperature, showing no warpage, and a flip package at an elevated temperature, showing warpage, in the related art.
Figure 1:
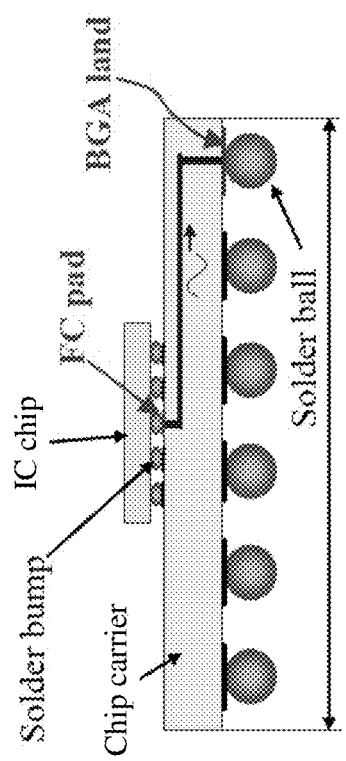
FIG. 1 is a schematic diagram illustrating a cross section of a flip chip package in the related art.

The exemplary embodiments of the disclosure and their various features and advantageous details are explained more fully with reference to the non-limiting exemplary embodiments that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary embodiments of the disclosure. The examples used herein are intended to merely facilitate an understanding of ways in which the exemplary embodiments of the disclosure may be practiced and to further enable those of skill in the art to practice the exemplary embodiments of the disclosure. Accordingly, the examples should not be construed as limiting the scope of the exemplary embodiments of the disclosure.

As described above, there remains a need to reliably form a "wet" contact between solder bumps of the integrated circuit (IC) chip and the solder layers of the opposing flip chip (FC) attaches of the chip carrier at an elevated temperature, where warping of the IC chip and the chip carrier may occur in a flip chip package.

A series of experiments was conducted to understand the effects of various materials and processes on the warpage of IC chips. When photosensitive polyimide (PSPI) monitor wafers, which had a PSPS layer formed on the front side of the wafer, were compared to fully processed wafers, designated "Cuba" wafers, the singulated dies from the PSPS monitor wafers warped less than those from the Cuba wafers over a heating and cooling cycle from room temperature to 250° C.

Figure 3:
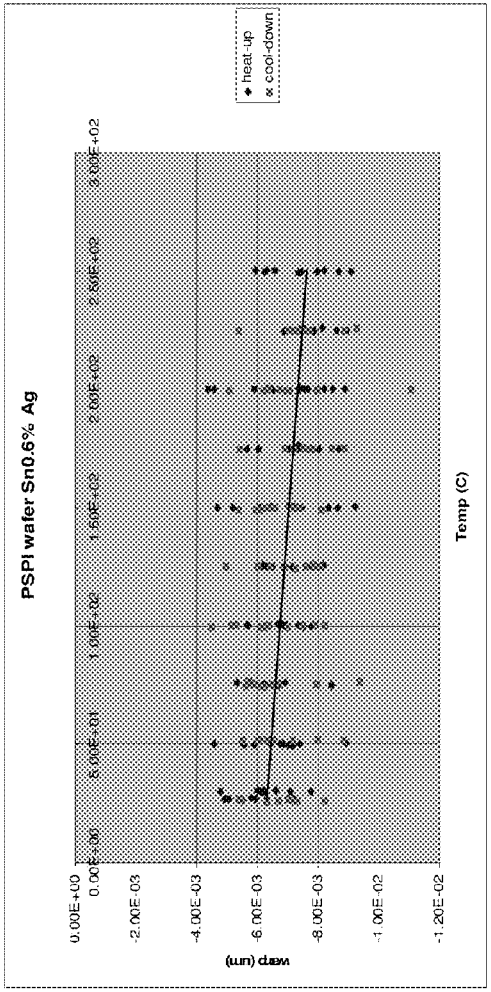
FIG. 3 is a graph illustrating measures of warping of a wafer upon which a photosensitive polyimide (PSPI) layer is formed to heating and cooling, in an exemplary embodiment.
Figure 4:
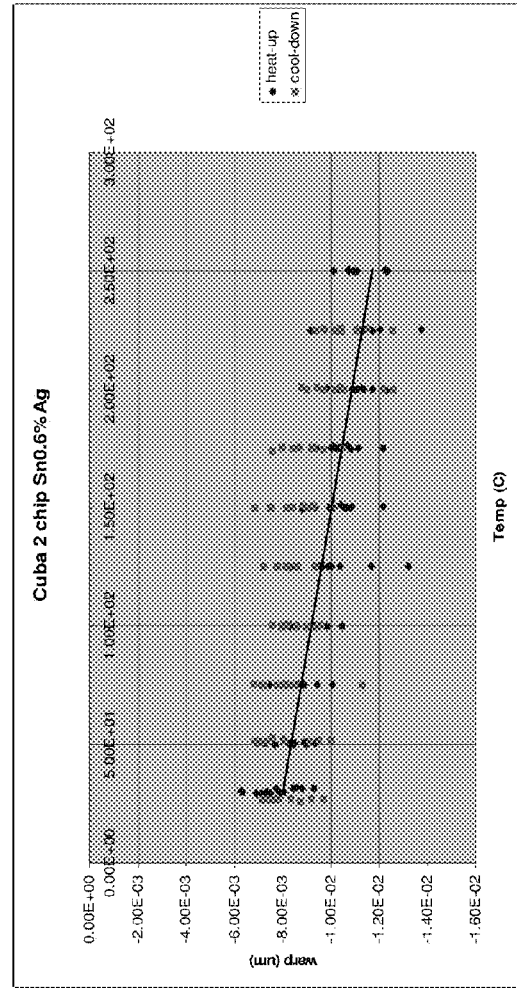
FIG. 4 is a graph illustrating measures of warping of a product wafer with multiple BEOL (back end of line) layers to heating and cooling in an exemplary embodiment.

The die backside warpage of singulated dies from the PSPI monitor wafers showed less warpage, i.e., less than 2 μm in FIG. 3, when compared to the singulated dies from the Cuba wafers, i.e., approximately 4 μm in FIG. 4, even when both types of dies had solder bumps using the same tin-silver (Sn—Ag) solder composition.

Figure 5A:
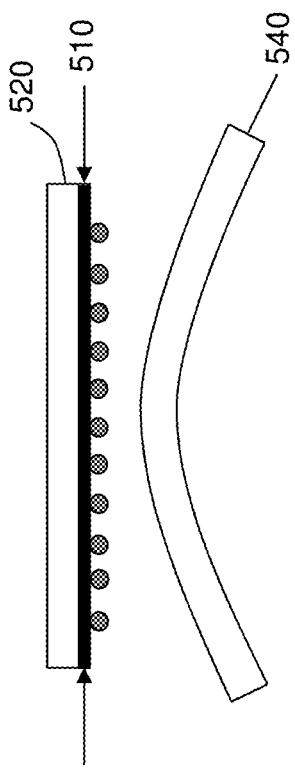
FIG. 5A is a schematic diagram illustrating a cross section of a flip chip package, including an IC chip on which a tensile layer is formed on a front side of the IC chip, that produces a flat IC chip relative to a positively warped chip carrier at an elevated temperature in an exemplary embodiment.
Figure 5B:
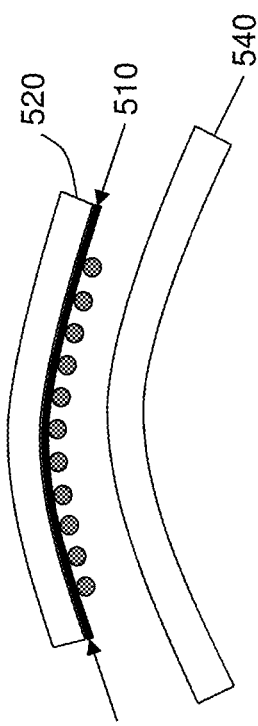
FIG. 5B is a schematic diagram illustrating a cross section of a flip chip package, including an IC chip on which a tensile layer is formed on a front side of the IC chip, that produces a positively warped IC chip relative to a positively warped chip carrier at an elevated temperature in an exemplary embodiment.

The PSPI layer on the front side of PSPI monitor wafers has the physical characteristics of a tensile film, which may counteract and even overcome the negative warpage of a wafer upon heating. Conceptually, a tensile film wants to be "smaller" than the substrate, e.g., the front side of the IC chip, upon which it may be deposited. Referring to FIG. 2, at an elevated temperature of 245° C., the IC chip 220 shows a slight negative warp; whereas, the chip carrier 240 shows a positive warp. However, as FIGS. 5A and 5B illustrate, respectively, a tensile film 510 formed on the front side of the IC chip 520 may produce tensile forces (inwardly directed arrows) that may counteract and even overcome the negative warpage at an elevated temperature, to produce a flat IC chip or an IC chip with positive warpage. Such a flat or positively warped IC chip 520 may significantly reduce the distance between the solder of the solder bumps of the IC chip 520 and the solder of the opposing FC attaches on the flat or positively warped chip carrier 540, to make possible "wetting" of the two opposing solders in a high quality electrical solder connection.

Prior to forming the flip chip package, the IC chip should remain flat during its processing, so as to more uniformly form, for example, the underbumps and solder bumps on the top side of the IC chip. In particular, forming the solder bumps requires heating of the solder being applied to the FC attaches and this heating could induce negative warping of the IC chip. To achieve a flat IC chip, tensile films may be formed on both the front side and backside of the IC chip, prior to forming the underbumps and the solder bumps on the top side of the IC chip. The backside tensile film may subsequently be removed by, for example, grinding of the backside of the IC chip, to leave only a single tensile film on the front side of the IC chip. Re-heating of the solders of the solder bumps and the FC attaches of the flip chip package may then effect better "wetting", when the IC chip, having a single front side tensile layer that provides one of: a flat and positive warpage, and the chip carrier having an inherent positive warpage are joined.

Similar in conception, is the deposition of a compressive film on the backside of the IC chip, after IC chip fabrication, formation of underbumps and solder bumps on the IC chip, and testing of the IC chip, and before re-heating of the solders of the solder bumps and the FC attaches of the flip chip package, to effect better "wetting" and chip-join of the flip chip package. A compressive film wants to be "larger" than the substrate, i.e., the backside of the IC chip, upon which it is deposited. As FIGS. 6A and 6B illustrate, respectively, a compressive film 610 formed on the backside of the IC chip 620 produces compressive forces (outwardly directed arrows) that may counteract and even overcome the negative warpage at an elevated temperature, to produce a flat IC chip or an IC chip with positive warpage. Such a positive warpage of the IC chip 620 may significantly reduce the distance between the solder of the solder bumps of the IC chip 620 and the solder of the opposing FC attaches on the positively warped chip carrier 640, to make possible "wetting" of the two opposing solders in a high quality electrical solder connection.

Figure 7A:
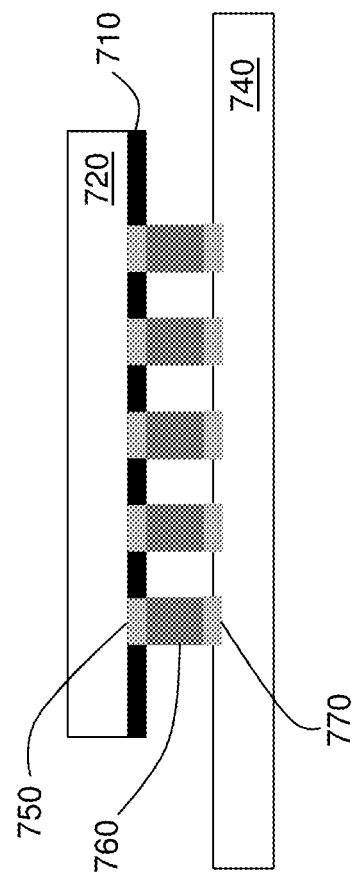
FIG. 7A is a schematic diagram illustrating a cross section of a flip chip package at room temperature, including an IC chip on which a tensile layer is formed on a front side of the IC chip, and a plurality of continuous solder columns between the IC chip and the chip carrier in an exemplary embodiment.

Referring to the cross section illustrated in FIG. 7A, a flip chip package at room temperature may comprise a chip carrier 740, on which flip chip (FC) attaches 770 are formed on a top surface of the chip carrier 740. The flip chip package may also comprise an integrated circuit (IC) chip 720 that is positioned above the chip carrier 740. The IC chip 720 may have a front side that faces the chip carrier 740 and a backside, which is adjacent to silicon layers of the IC chip 720. A tensile film 710 may be formed on the front side of the IC chip 720 and may range from a thickness of 1 micrometer to 10 micrometers. The tensile film may comprise one of: silicon nitride (SiN), aluminum (Al), and photosensitive polyimide (PSPI). The tensile film 710 may contain a plurality of openings, each of which exposes a portion of the front side of the IC chip 720 and in each of which an underbump 750 may be formed. A plurality of continuous solder columns 760 may be located between the IC chip 720 and the chip carrier 740. Each of the continuous solder columns 760 may extend from an FC attach on a top surface of the chip carrier 740 to an opposing, i.e., vertically-aligned, underbump 750 formed on the front side of the IC chip 720 within an opening of the tensile film 710. Each of the plurality of continuous solder columns 760 may be devoid of an interface, caused by non-wetting.

Figure 7B:
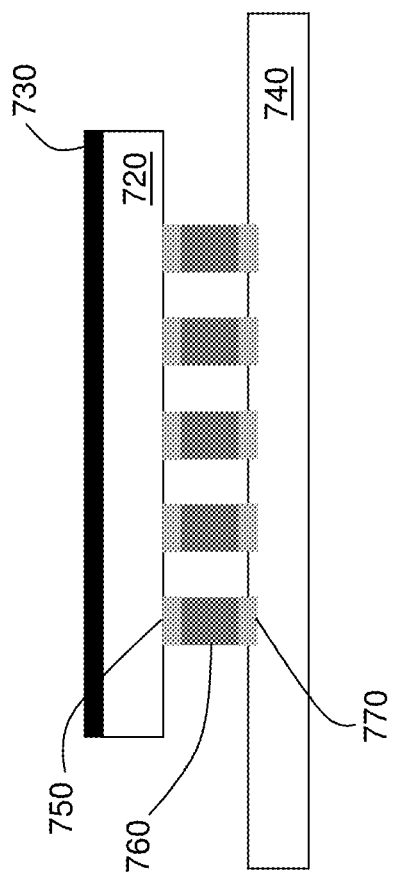
FIG. 7B is a schematic diagram illustrating a cross section of a flip chip package at room temperature, including an IC chip on which a compressive layer is formed on a backside of the IC chip, and a plurality of continuous solder columns between the IC chip and the chip carrier in an exemplary embodiment.

Alternatively, as illustrated in the cross section of FIG. 7B, a flip chip package at room temperature may comprise a chip carrier 740, on which flip chip (FC) attaches 770 are formed on a top surface of the chip carrier 740. The flip chip package may also comprise an integrated circuit (IC) chip 720 that is positioned above the chip carrier 740. The IC chip 720 may have a front side that faces the chip carrier 740 and a backside, which is adjacent to silicon layers of the IC chip 720. A compressive film 730 may be formed on the backside of the IC chip 720 and may range from a thickness of 1 micrometer to 10 micrometers. The compressive film 730 may comprise an oxide. A plurality of continuous solder columns 760 may be located between the IC chip 720 and the chip carrier 740. Each of the continuous solder columns 760 may extend from an FC attach on a top surface of the chip carrier 740 to an opposing underbump 750 formed on the front side of the IC chip 720. Each of the plurality of continuous solder columns 760 may be devoid of an interface, caused by non-wetting.

Figure 8:
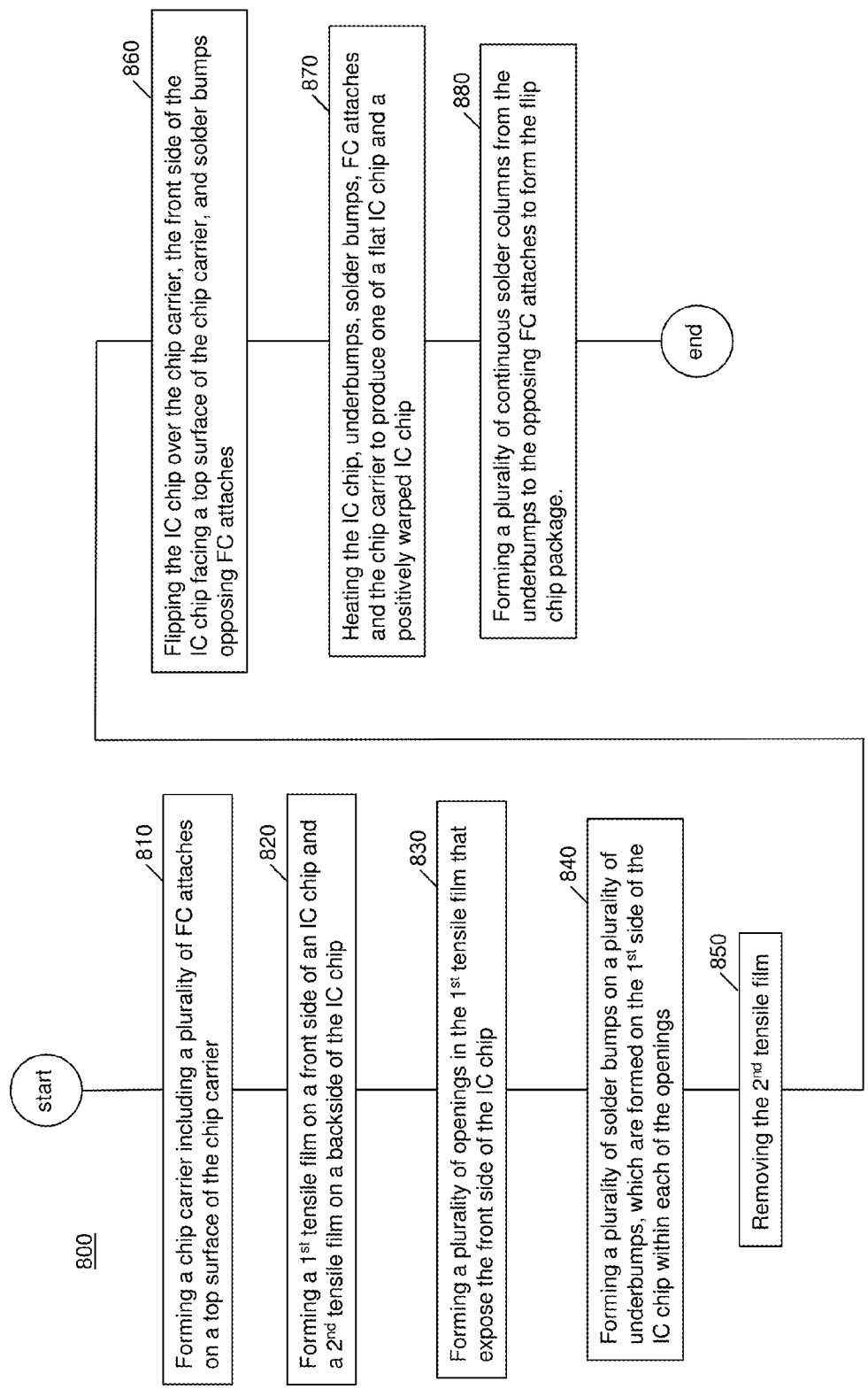
FIG. 8 is a flowchart 800 illustrating a method of making a flip chip package that reduces warpage of an IC chip on which a tensile layer is formed on a front side of the IC chip in an exemplary embodiment.

Referring to the flowchart 800 of FIG. 8, a method of making a flip chip package may comprise, forming a chip carrier including a plurality of flip chip (FC) attaches that are formed on a top surface of the chip carrier, 810. A solder layer may be formed on each of the plurality of FC attaches. The method may also comprise forming a first tensile film on a front side of an integrated circuit (IC) chip and a second tensile film on a backside of the IC chip, 820. The method may further comprise forming a plurality of openings in the first tensile film by, for example, patterned etching, that expose the front side of the IC chip, 830. The method may yet further comprise forming a plurality of solder bumps on a corresponding plurality of underbumps, which are formed on the front side of the IC chip within each of the plurality of openings in the first tensile film, 840. Each of the solder bumps may be formed by applying heated solder to each of the underbumps. Subsequently, the method may yet further comprise, removing the second tensile film from the backside of the IC chip 850, by, for example, grinding of the second tensile film. The method may yet further comprise, "flipping" and positioning the IC chip over the chip carrier, such that the front side of the IC chip faces the top surface of the chip carrier, and each of the solder bumps formed on the IC chip opposes a solder layer formed on a corresponding one, i.e., vertically-aligned, of the plurality of FC attaches of the chip carrier, 860. The method may yet further comprise, heating the IC chip, the underbumps, the solder bumps, the solder layers formed on each of the plurality of FC attaches and the chip carrier to an elevated temperature, for example, from 170° C. to 250° C., to produce one of a flat IC chip and a positively warped IC chip, 870. The producing of one of a flat IC chip and a positively warped IC chip may result from reducing a distance, i.e., reducing a negative warpage of the IC chip, between the solder bumps on the IC chip and the opposing FC attaches on the positively warped chip carrier. This reduction in distance between the solder bumps and the opposing FC attaches may enhance a probability of wetting the opposing solders of the vertically-aligned solder bumps and solder layers of the FC attaches. The method may yet further comprise, forming a plurality of continuous solder columns at room temperature from the underbumps to the opposing FC attaches, to form the flip chip package, 880. The forming of the plurality of continuous solder columns, which are devoid of a non-wetted interface, may come about by the contacting of "wetted" opposing solders from the solder bumps and the FC attaches.

Figure 9:
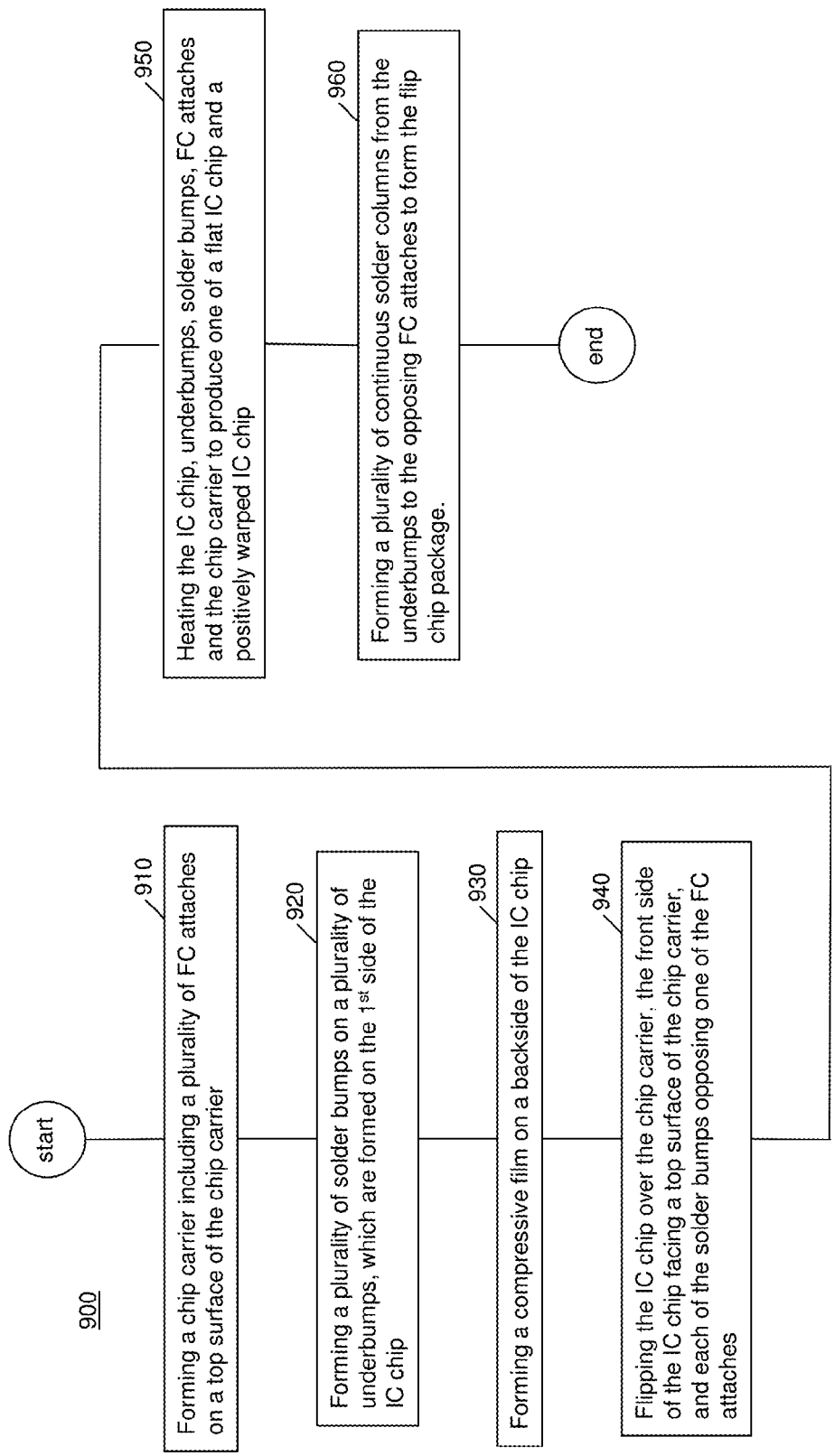
FIG. 9 is a flowchart 900 illustrating a method of making a flip chip package that reduces warpage of an IC chip on which a compressive layer is formed on a backside of the IC chip in an exemplary embodiment.

Referring to the flowchart 900 of FIG. 9, a method of making a flip chip package may comprise, forming a chip carrier including a plurality of flip chip (FC) attaches that are formed on a top surface of the chip carrier, 910. A solder layer may be formed on each of the plurality of FC attaches. The method may also comprise forming a plurality of solder bumps on a corresponding plurality of underbumps, which are formed on the front side of the IC chip, 920. Subsequently, the method may further comprise, forming a compressive film on a backside of the IC chip, 930. The method may yet further comprise, "flipping" and positioning the IC chip over the chip carrier, such that the front side of the IC chip faces the top surface of the chip carrier, and each of the solder bumps formed on the IC chip opposes a solder layer formed on a corresponding one, i.e., being vertically-aligned, of the plurality of FC attaches of the chip carrier, 940. The method may yet further comprise, heating the IC chip, the underbumps, the solder bumps, the solder layers formed on each of the plurality of FC attaches and the chip carrier to an elevated temperature, for example, from 170° C. to 250° C., to produce one of a flat IC chip and a positively warped IC chip, 950. The producing of one of a flat IC chip and a positively warped IC chip may result from reducing a distance, i.e., reducing a negative warpage of the IC chip, between the solder bumps on the IC chip and the opposing FC attaches on the positively warped chip carrier. This reduction in distance between the solder bumps and the opposing FC attaches may enhance a probability of wetting the opposing solders of the vertically-aligned solder bumps and solder layers of the FC attaches. The method may yet further comprise, forming a plurality of continuous solder columns at room temperature from the underbumps to the opposing FC attaches, to form the flip chip package, 960. The forming of the plurality of continuous solder columns, which are devoid of a non-wetted interface, may come about by the contacting of "wetted" opposing solders from the solder bumps and the FC attaches.

In the packaging, the chip may be mounted in a single chip package (such as a plastic carrier, with leads that are affixed to a motherboard or other higher level carrier) or in a multichip package (such as a ceramic carrier that has either or both surface interconnections or buried interconnections). In any case the chip may then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

What is claimed is:

1. A method of making a flip chip package, comprising:
   forming a chip carrier including a plurality of flip chip (FC) attaches located on a top surface of said chip carrier, a solder layer being formed on each FC attach;
   forming a first tensile film on a front side of an integrated circuit (IC) chip and a second tensile film on a backside of said IC chip;
   forming a plurality of openings in said first tensile film that expose said front side of said IC chip;
   forming a plurality of solder bumps on a corresponding plurality of underbumps, which are formed on said first side of said IC chip within each of said openings;
   removing said second tensile film from said backside of said IC chip;
   flipping said IC chip over said chip carrier, said front side of said IC chip facing said top surface of said chip carrier, each of said solder bumps opposing a solder layer formed on one of said FC attaches of said chip carrier;
   heating said IC chip, said underbumps, said solder bumps, said solder layers formed on said FC attaches, and said chip carrier to an elevated temperature, producing one of a flat IC chip and a positively warped IC chip; and
   forming a plurality of continuous solder columns at room temperature from said underbumps to each of said opposing FC attaches, to form said flip chip package.

2. The method of claim 1, said forming a plurality of openings in said first tensile film comprising patterned etching of said first tensile film.

3. The method of claim 1, said forming a plurality of solder bumps on a plurality of underbumps comprising, applying heated solder to each of said underbumps, to form said solder bump.

4. The method of claim 1, said removing of said second tensile film being accomplished by grinding.

5. The method of claim 1, said producing one of a flat IC chip and a positively warped IC chip, reducing a distance between said solder bumps and said FC attaches, to enhance a probability of wetting opposing solders.

6. The method of claim 5, said opposing solders that are wetted, forming said plurality of continuous solder columns.

7. The method of claim 6, each of said plurality of continuous solder columns being devoid of an interface, caused by non-wetting.

8. The method of claim 1, said elevated temperature ranging from 170° C. to 250° C.

* * * * *